United States Patent
Stribling, Jr.

[11] Patent Number: 6,119,986
[45] Date of Patent: *Sep. 19, 2000

[54] THIN-FILM SOLAR REFLECTORS AND METHODS

[75] Inventor: Ray A. Stribling, Jr., Redondo Beach, Calif.

[73] Assignee: Hughes Electronics Corporation, El Segundo, Calif.

[*] Notice: This patent is subject to a terminal disclaimer.

[21] Appl. No.: 08/897,849

[22] Filed: Jul. 21, 1997

[51] Int. Cl.[7] ........................................ B64G 1/44
[52] U.S. Cl. ........................... 244/173; 136/245; 136/292
[58] Field of Search ................ 244/173, 158 R; 136/245, 246, 292; 126/692

[56] References Cited

U.S. PATENT DOCUMENTS

| 3,232,795 | 2/1966 | Gillette et al. | 136/246 |
| 3,690,080 | 9/1972 | Dillard | 244/173 |
| 3,778,312 | 12/1973 | Karius | 244/173 |
| 4,282,394 | 8/1981 | Lackey et al. | 136/245 |
| 4,513,734 | 4/1985 | Butler | 126/439 |
| 5,131,955 | 7/1992 | Stern et al. | 244/173 |
| 5,520,747 | 5/1996 | Marks | 244/173 |

FOREIGN PATENT DOCUMENTS

| 1764428 | 7/1971 | Germany . | |
| 54-57886 | 5/1979 | Japan | 136/246 |
| 0414689 | 5/1992 | Japan . | |
| 4-146897 | 5/1992 | Japan . | |
| 0511669 | 5/1993 | Japan . | |

OTHER PUBLICATIONS

Sokolsky, Ilene, et al., "Thin Film Solar Concentrator", Naval Research Laboratory, thin flim pp. 1–8.

*Primary Examiner*—Peter M. Poon
*Assistant Examiner*—Francis Palo
*Attorney, Agent, or Firm*—Terje Gudmestad; M. W. Sales

[57] ABSTRACT

Flexible, lightweight reflective sheets are positioned to concentrate solar radiation upon spacecraft solar panels. The sheets are positioned with inner and outer spring members which urge each sheet towards a planar configuration and further urge the sheet in a rotation away from a solar panel face. Restraint members in the form of tethers limit this rotation to place the sheet in a deployed position in which it defines an angle with the panel to reflect solar radiation onto the panel face. The increased incident radiation permits a reduction of the number of solar cells with consequent savings in spacecraft cost and weight. The spring members are configured to permit rotation to a stowed position behind the solar panel. In this position, the tethers are received into guides which are configured to initiate automatic deployment of the spring members and their reflective sheets.

39 Claims, 6 Drawing Sheets

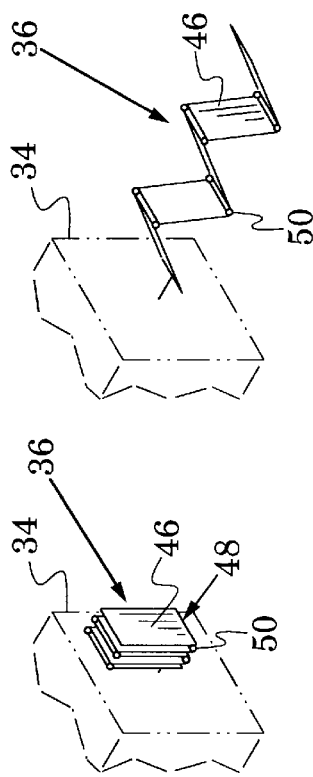
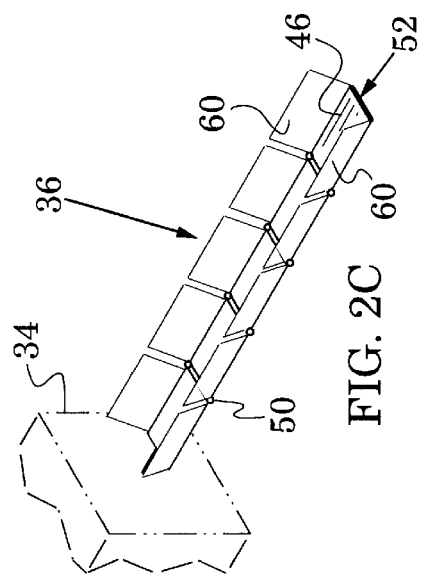
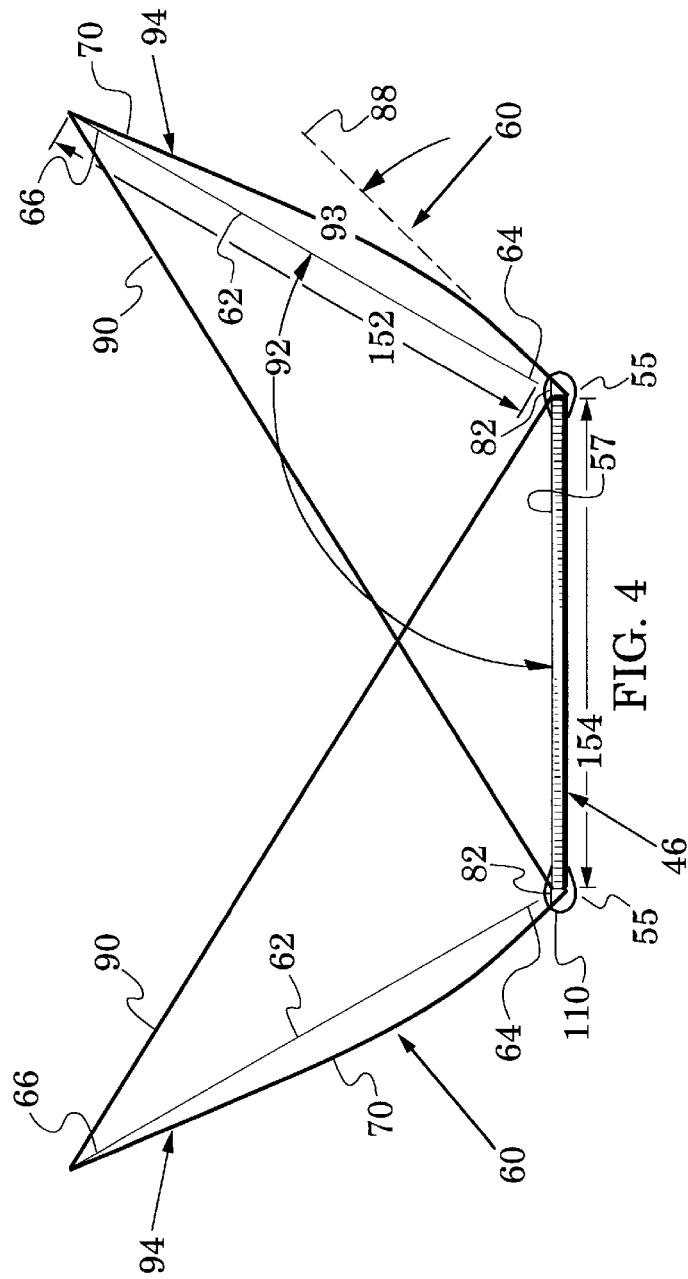

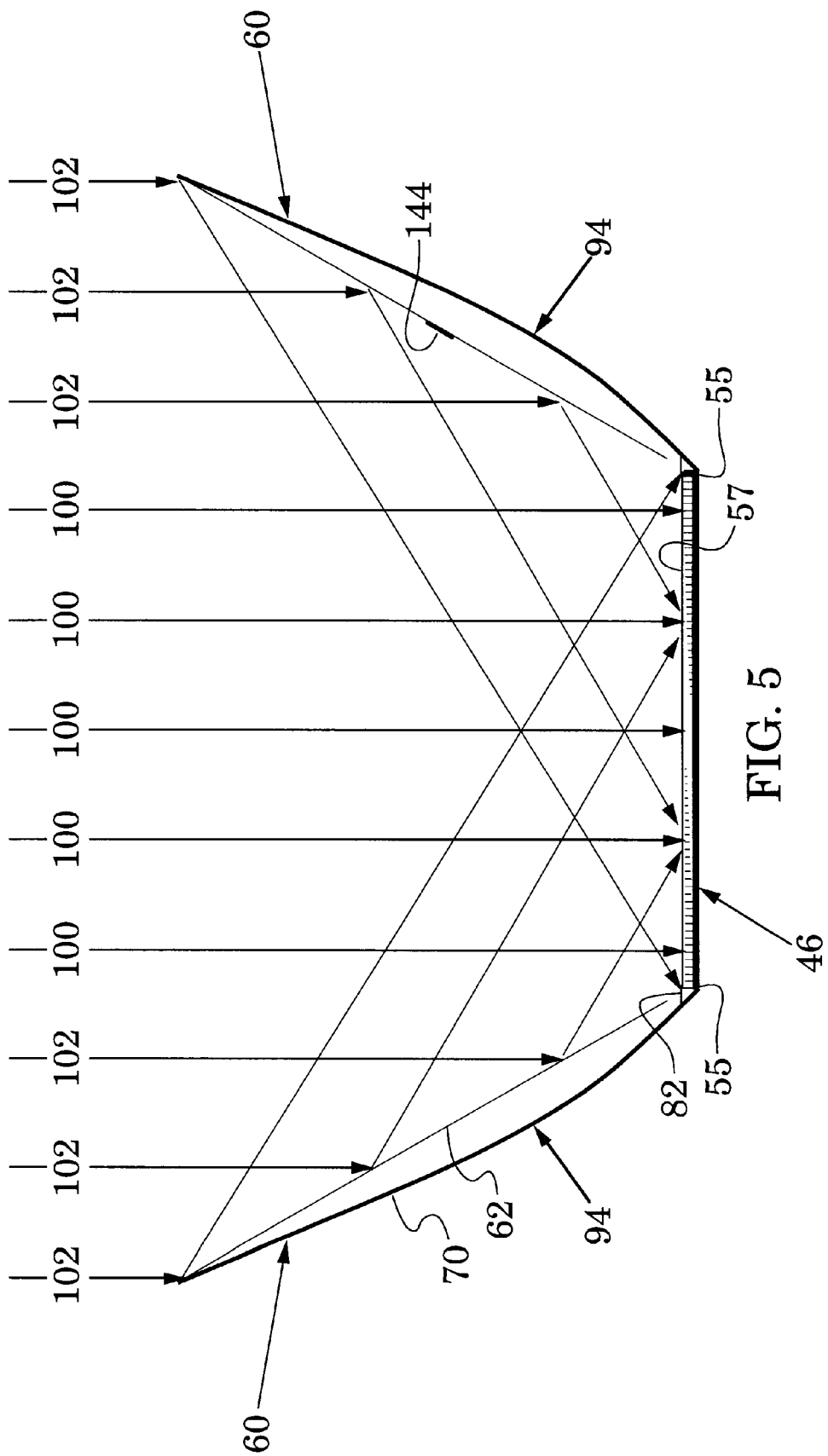

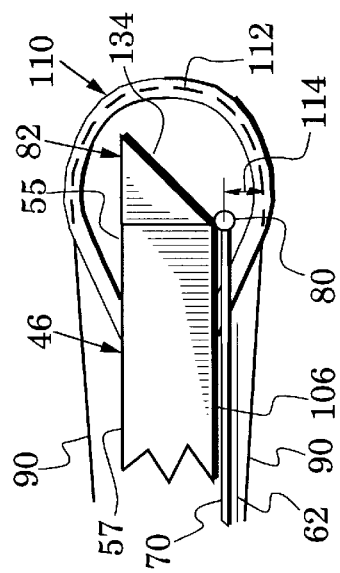
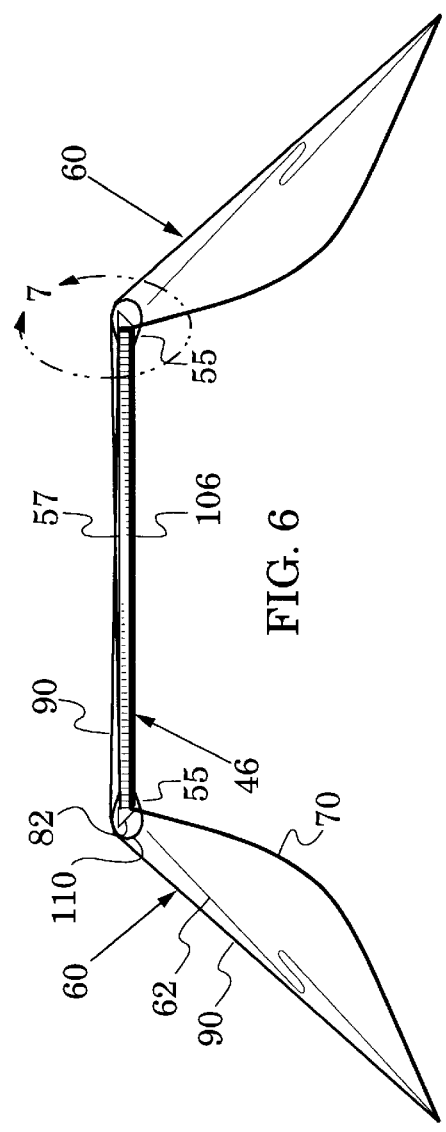
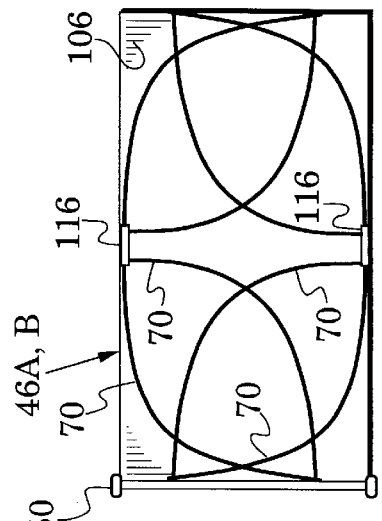
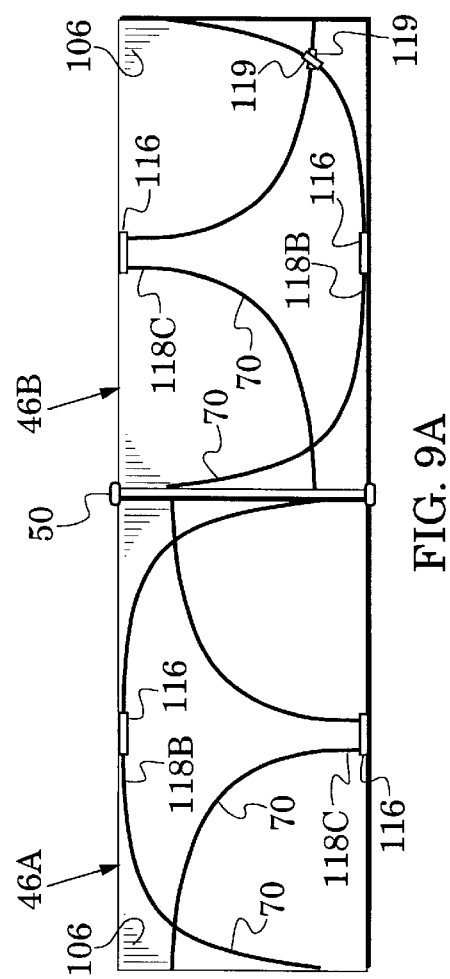

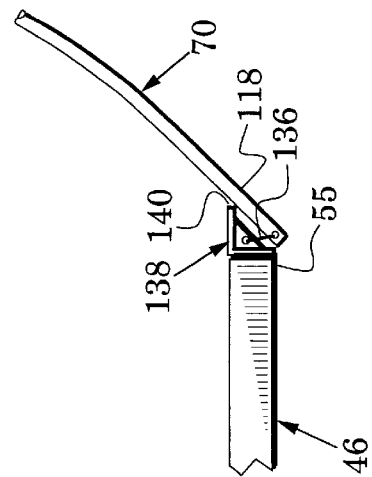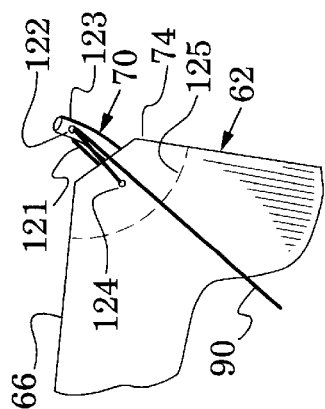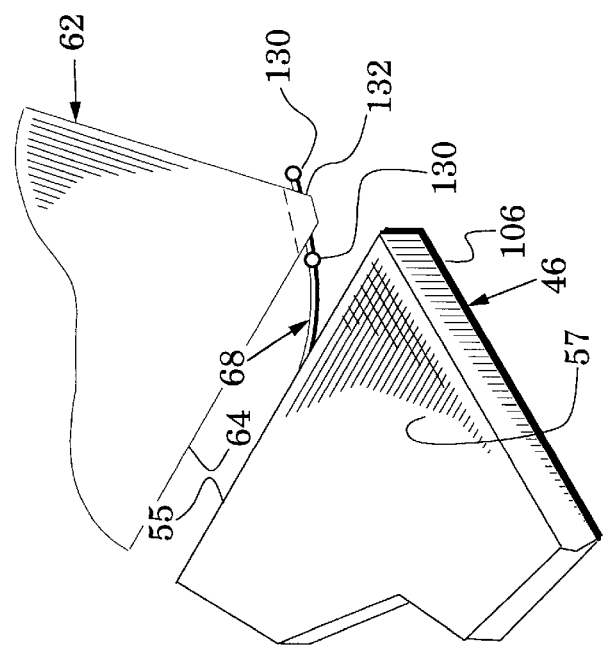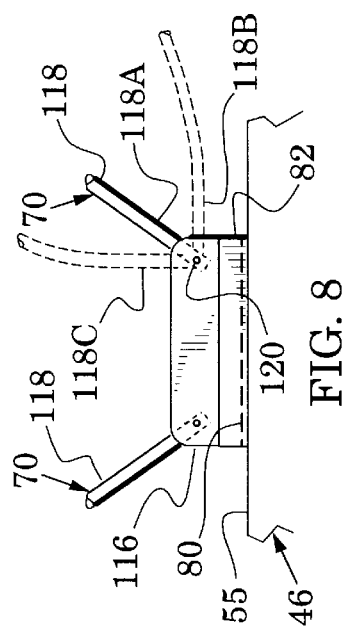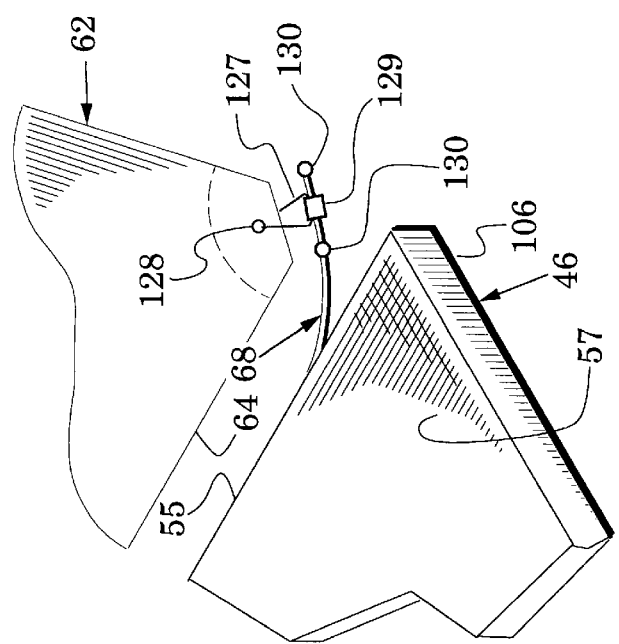

THIN-FILM SOLAR REFLECTORS AND METHODS

BACKGROUND OF THE INVENTION

1. Field of the Invention

The present invention relates generally to spacecraft and, more particularly, to spacecraft solar arrays.

2. Description of the Related Art

Spacecraft typically carry solar cells as a primary energy source with rechargable batteries providing energy storage for eclipse operations. The solar cells are positioned on the spacecraft so that they are exposed to solar radiation.

On spinning spacecraft, solar cells are generally arranged about the outside of a spinning spacecraft body. Accordingly, only a fraction of the cells are exposed to solar radiation at any instant in time. On body-stabilized spacecraft, in contrast, solar cells are typically arranged in planar arrays and carried on solar wings which extend from opposite sides of a spacecraft body. Preferably, the solar wings rotate to keep them as orthogonal to the solar radiation as possible. Because the solar wings can be quite long in their deployed configuration, they generally are formed of a plurality of planar solar panels which are coupled together in an accordion arrangement so that they can be collapsed to a smaller stowed configuration for spacecraft launch.

The number of solar cells that must be carried by a spacecraft is a function of the anticipated spacecraft power drain and the efficiency of the solar cells. Although high-efficiency solar cells reduce the number of cells required by a specific spacecraft, they are quite expensive. Because weight and weight-related costs also increase with the number of solar cells, there is a considerable incentive to reduce the quantity of solar cells that a spacecraft must carry.

Accordingly, efforts have been extended to concentrate solar radiation upon solar cells with reflective surfaces that are positioned to reflect radiation upon the cells. Solar radiation that would otherwise have passed by a solar wing is thus redirected to be incident upon the solar cells. Energy conversion efficiency of this reflected radiation is typically less than that of direct radiation because of a lesser angle of incidence. The additional radiation also contributes to solar cell heating which decreases the radiation-to-electrical energy conversion efficiency. Nonetheless, the additional incident radiation facilitates a significant reduction in the number of spacecraft solar cells with consequent savings in spacecraft weight and cost.

A variety of reflector systems have been proposed. In an exemplary system of U.S. Pat. No. 4,282,394, reflector arms are carried on both inboard and outboard frames. Each of the reflector arms is formed of a plurality of hinged arm sections and each arm section of the inboard frame carries a reflective plastic sheet that is wound on a spring-biased roll. An end of each sheet is attached to a respective arm section on the outboard frame.

During deployment, an extensible shaft moves the outboard frame away from the inboard frame and each reflective sheet is unrolled to reflect solar radiation onto solar cells. Although this reflector system concentrates solar radiation, its complex structure (e.g., hinged arms, inboard and outboard frames and extensible shaft) significantly contributes to spacecraft weight and cost.

In a Naval Research Laboratory design, one-piece, thin-film reflectors are positioned on oppostie sides of a plurality of solar panels that are coupled together in an accordion arrangement. Edges of each thin-film reflector carry cables which are coupled with tension springs between a pair of rotatable booms. The tension springs cause the cables to assume a catenary shape which enhances the flatness of the reflector film. In order to fold the solar panels into a stowed position, the booms rotate to lie alongside the panels and the thin-film reflector is rolled (e.g., from the reflector center) so that it lies parallel to the booms. Although this reflector system is potentially lighter and simpler than the system described above, it still involves numerous mechanical parts (e.g., booms, cables and pulleys) which have significant weight.

Other reflector systems are described in U.S. patent application Ser. No. 08/081,909, filed Jun. 18, 1993, and now abandoned (as a continuation of application Ser. No. 07/802,972, filed Dec. 6, 1991 and now abandoned), titled "Augmented Solar Array with Dual Purpose Reflectors" and assigned to Hughes Electronics, the assignee of the present invention. In an exemplary system, a reflector is formed from a reflective material (e.g., an aluminized polyimide film) that is carried by a peripheral frame or affixed over a ribbed structure or a thin metal sheet. Each reflector is coupled to a solar panel by a hinge mechanism. Prior to spacecraft launch, the reflector is rotated to lie proximate to the solar cell face of the solar panel. After launch, the hinge mechanism rotates the reflector to a position in which it forms a deployment angle with the solar cell face. In an exemplary hinge mechanism, a hinge spring urges the reflector to rotate away from the solar cell face. The hinge mechanism includes a stop member which halts this rotation when the reflector reaches the deployment angle.

In another reflector system embodiment, reflectors are fabricated by suspending a reflective film between a pair of flexible rods that are rigidly coupled to a solar panel. The rods are typically tethered such that the reflectors lie parallel to the solar cell face prior to spacecraft launch. Deployment is effected by untethering which allows the rods to whip directly to a position in which the reflective film forms a deployed angle with the panel.

Although the latter reflector system effectively redirects radiation, the solar reflectors are stowed over the solar cell face of the solar panels. Accordingly, they block the use of the solar panels during any period (e.g., a transfer orbit) in which the solar panels are in a storage position that prevents reflector deployment.

SUMMARY OF THE INVENTION

The present invention is directed to a simple, lightweight and inexpensive solar reflector which can concentrate solar radiation onto a panel face of a solar panel and be stowed adjacent to a back face of the panel.

These goals are realized with at least one flexible, reflective sheet having an inner part and an outer part, at least one inner spring member that couples the inner part to the panel and urges the inner part towards the panel and at least one outer spring member that couples the outer part to the panel and urges the outer part away from the panel so that the inner and outer spring members cooperatively urge the reflective sheet towards a planar configuration.

The outer spring member is arranged to urge the reflective sheet along a rotation away from the panel face and at least one restraint member is arranged to limit this rotation so that the reflective sheet is restrained in a deployed position in which it defines an angle with the panel to reflect solar radiation upon the panel face. A stop is carried by the panel to abut an inner portion of the outer spring member to facilitate the urging of the outer spring member that results in the sheet rotation.

In an embodiment, the reflective sheet is a metallic-coated thin-film polymer, the inner and outer spring members are resilient, elongate members and the restraint member is a tether. Accordingly, reflectors of the invention are extremely light and inexpensive. Preferably, the spring members and the tether are electrically conductive to form conduction paths that discharge potentially damaging electrostatic charges away from the reflective sheet.

Preferably, the spring members are rotatably coupled to the panel to facilitate rotation of the reflective sheet and the spring members to a stowed position behind the panel. The outer spring member rotates about a rotation point and a guide receives the tether when the spring member is in the stowed position. The guide is configured to guide the tether along a guide path which is spaced from the rotation point to create a mechanical moment and thereby facilitate automatic rotation of the outer spring member from the stowed position to the deployed position.

Because each reflective sheet is stored behind its respective solar panel, at least one solar panel can be positioned during a time (e.g., a transfer orbit).

The novel features of the invention are set forth with particularity in the appended claims. The invention will be best understood from the following description when read in conjunction with the accompanying drawings.

BRIEF DESCRIPTION OF THE DRAWINGS

FIGS. 2A–2C are enlarged views of a solar wing on the spacecraft of FIG. 1 which illustrate movement of the solar wing between a stowed configuration and a deployed configuration;

FIG. 4 is an end view of the solar panel and solar reflectors of FIG. 3;

FIG. 5 is a view similar to FIG. 4 which illustrates concentration of solar radiation upon the solar panel by the solar reflectors;

FIG. 6 is a view similar to FIG. 4 which illustrates an interim position of the solar reflectors between the deployed position of FIG. 4 and a stowed position;

FIG. 7 is an enlarged view of structure within the curved line 7 of FIG. 6 with an outer spring member of FIG. 6 shown in a stowed position;

FIG. 8 is an enlarged view of inner portions of outer spring members of FIG. 3 which illustrates spring member movement between deployed and stowed positions;

FIG. 9A is a rear view of adjacent solar panels of the solar wing of FIG. 2C which illustrates alternate stowed positions of outer spring members of FIG. 3;

FIG. 9B illustrates the outer spring members of FIG. 9A when the solar panels are folded to the stowed configuration of FIG. 2A;

FIG. 10 is an enlarged view of structure within the curved line 10 of FIG. 3 which illustrates a rotatable coupling between a reflective sheet and an outer spring member of FIG. 3;

FIGS. 11A and 11B are enlarged views of an inner spring member of FIG. 3 which illustrates rotatable coupling embodiments between an inner spring member and a reflective sheet of FIG. 3; and FIG. 12 is an enlarged view of an inner portion of an outer spring member of FIG. 3 which illustrates another rotatable coupling embodiment between the outer spring member and the solar panel of FIG. 3.

DETAILED DESCRIPTION OF THE PREFERRED EMBODIMENTS

FIGS. 1–12 illustrate solar reflectors in which flexible, lightweight reflective sheets are positioned with inner and outer spring members which urge each sheet towards a planar configuration and further urge the sheet in a rotation away from a solar panel face. Restraint members limit this rotation to place the sheet in a deployed position in which it defines an angle with the panel to reflect solar radiation onto the panel face. The increased incident radiation permits a reduction of the number of solar cells with consequent savings in spacecraft cost and weight. In addition, the reflective sheets are stowed behind their associated solar panel so as to not block incident sunlight.

Figure 1:
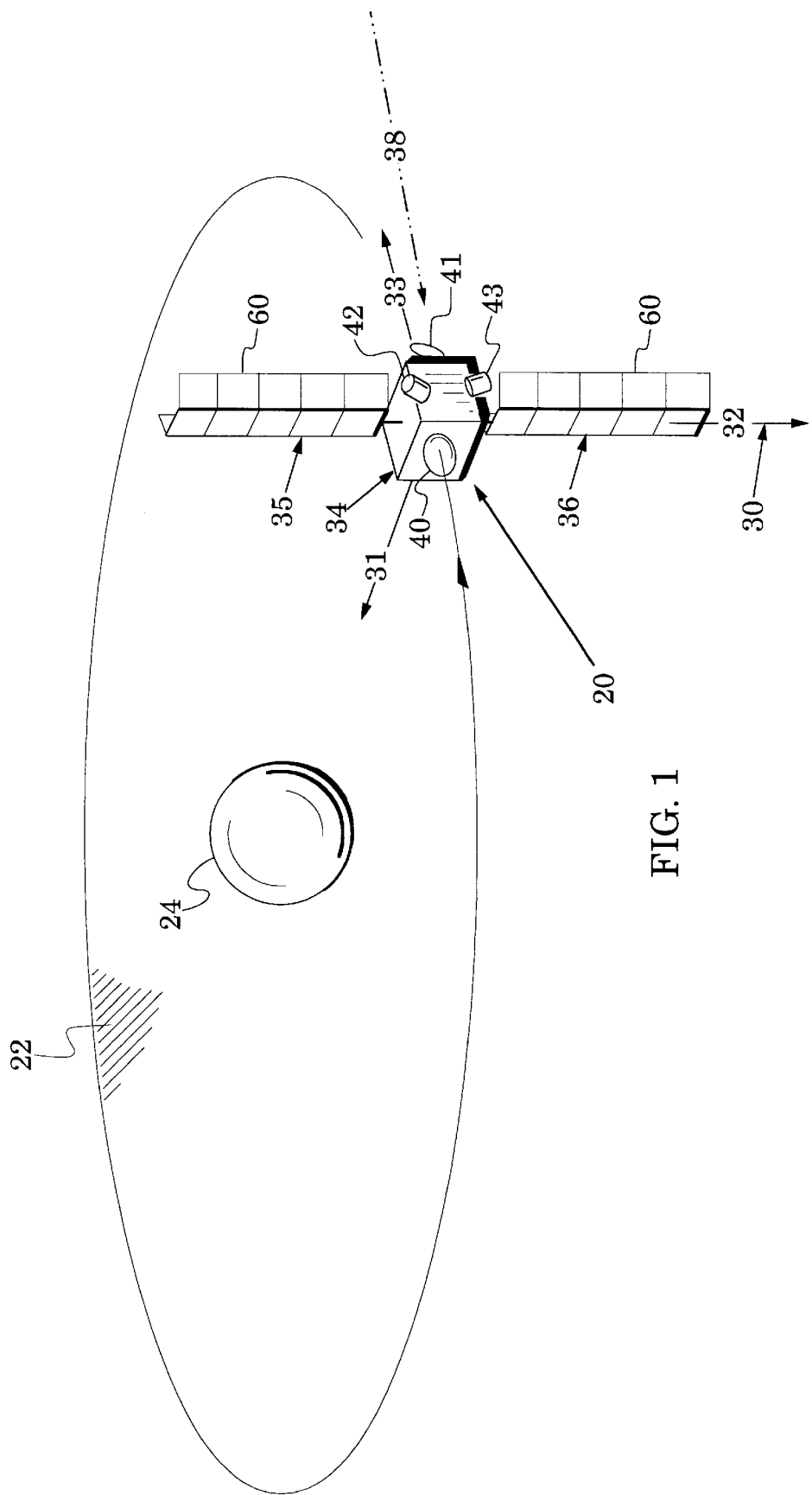
FIG. 1 is a perspective view of a spacecraft in an orbital plane about a celestial body.

In particular, FIG. 1 illustrates a body-stabilized spacecraft 20 which is traveling in an orbital plane 22 about a celestial body such as the Earth 24. The spacecraft's attitude can be described with reference to an orthogonal coordinate system 30 which has an origin at the spacecraft's center of mass. The coordinate system 30 includes a yaw axis 31 which is directed at the Earth 24, a pitch axis 32 which is orthogonal to the orbital plane 22 and a roll axis 33 which is aligned with a velocity vector of the spacecraft 20.

The spacecraft 20 has a body 34 which carries a pair of solar wings 35 and 36 that rotate about the pitch axis 32 so that solar cells of the solar wings are as orthogonal as possible to a Sun line 38 between a Sun (not shown) and the spacecraft 20. However, unless the solar wings can also be inclined from the pitch axis 32, they will be tilted from the Sun line 38 at summer and winter solstice because the Earth travels in an orbital plane which is tilted from the Earth's equatorial plane. Typically, the spacecraft body 34 also carries antennas 40 and 41 for communication with Earth stations and thrusters 42 and 43 for maintenance of spacecraft stationkeeping and attitude control.

Each of the solar wings 35 and 36 is typically formed of a plurality of hinged solar panels 46 as shown in FIG. 2A. This figure also shows that the panels 46 have been folded accordion fashion into a stowed configuration 48 adjacent to the spacecraft body 33. In FIG. 2B, the solar panels 46 are shown in a rotation about inter-panel hinges 50 which extends them to the planar, deployed configuration 52 of FIG. 2C.

FIG. 1 shows pairs of solar reflectors 60 of the present invention which are carried by the solar wings 35 and 36 to concentrate solar radiation onto the solar cells of the wings. The solar reflectors 60 are also shown in the deployed configuration 52 of FIG. 2C. Although not specifically shown in FIGS. 2A and 2B, the solar reflectors 60 rotate to stowed positions behind their respective solar panels prior to folding of the panels into the stowed configuration 48 of FIG. 2A.

Figure 3:
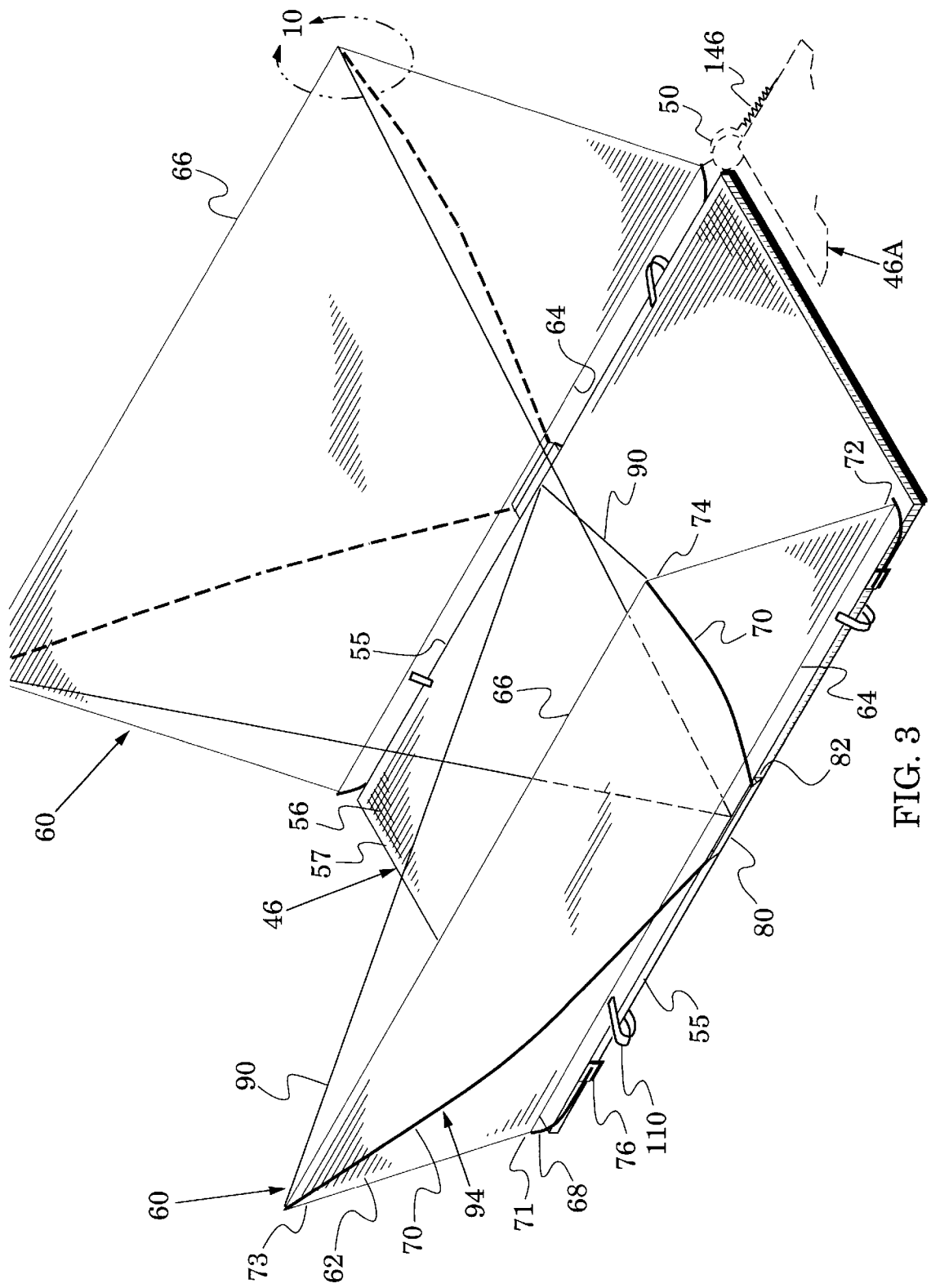
FIG. 3 is an enlarged view of a solar panel in the solar wing of FIG. 2C which illustrates a solar reflector embodiment of the present invention.

The enlarged views of FIGS. 3 and 4 illustrate a single solar panel 46 which extends laterally to a panel perimeter 55 and carries an array of solar cells 56 on a panel face 57. A pair of solar reflectors 60 is associated with the solar panel 46 and each reflector includes a reflective sheet 62 which has an inner part in the form of an inner margin 64 and an outer part in the form of an outer margin 66. Inner spring members 68 couple the inner margin 64 to the solar panel 46 and outer spring members 70 couple the outer margin 66 to the solar panel (to more clearly show other structures, the inner spring members are omitted from FIG. 4).

The inner spring members 68 are arranged to resiliently urge the inner margin 64 towards the solar panel 46 and the outer spring members 70 are arranged to urge the outer margin 66 away from the solar panel 46. In addition, the inner spring members 68 are coupled to different portions of the inner margin 64 (e.g., the opposed corners 71 and 72 of FIG. 3) and are arranged to urge these margin portions away from each other. Similarly, the outer spring members 70 are coupled to different portions of the outer margin 66 (e.g., opposed corners 73 and 74 of FIG. 3) and are arranged to urge these margin portions away from each other. Thus, the inner and outer spring members cooperatively urge the reflective sheet 62 towards a planar configuration. Accordingly, they achieve static equilibrium and accommodate thermal changes in the reflective sheet.

In the embodiment of FIGS. 3 and 4, each of the inner spring members 68 is formed of a resilient, elongate member which is rotatably coupled to the perimeter 55 of the solar panel 46 by a hinge 76 (to more clearly show other structures, the hinge is omitted from FIG. 4). When pulled by the reflective sheet 62 and the outer spring members 70 to a distorted state, the inner spring members 68 assume the bent configuration of FIG. 3 in which they urge the opposed corners 71 and 72 away from each other and towards the solar panel 46.

In the embodiment of FIGS. 3 and 4, each of the outer spring members 70 is also formed of a resilient, elongate member which is rotatably coupled to the solar panel's perimeter 55. This rotatable coupling can be accomplished with various structures such as the hinge 80 of FIG. 3 (to more clearly show other structures, the hinge is omitted from FIG. 4) or a cord which is described below with reference to FIG. 10. A stop 82 is arranged so that it angularly restrains an inner portion of the outer spring member 70. This inner portion is accordingly directed along a broken direction line 88.

Each solar reflector 60 also includes restraint members in the form of tethers 90 which are formed, for example, of flexible cord and are connected between the outer margin 66 (e.g., the opposed corners 73 and 74) and the opposite side of the solar panel's perimeter 55. Because of opposition between the restraining action of the tethers 90 and the abutting action of the stop 82, each outer spring member 70 is pulled to a distorted state and assumes the bent configuration of FIGS. 3 and 4. In this configuration, the outer spring members 70 urge the opposed corners 73 and 74 away from each other and also away from the solar panel 46.

The resilient outer spring members 70 try to move to a relaxed linear state and, in so doing, they urge the reflective sheet 62 along a rotation away from the panel face 57. This rotation is limited by the tethers 90 so that the reflective sheet 62 is restrained in the deployed position of FIGS. 3 and 4. In this deployed position, the reflective sheet 62 defines a deployed angle 92 with the solar panel 46 and a restrained angle 93 with the direction line 88 (angles 92 and 93 are shown only in FIG. 4). The deployed angle 92 is sufficient to cause the reflective sheet 62 to reflect radiation onto the panel face 57. The length of the tether 90 and the angle set by the stop 82 force the outer spring member 70 to a desired deployed angle. The stop acts to urge the reflective sheet 62 towards a stowed position while the tether acts to restrain the reflective sheet 62 in a deployed position. These actions resiliently balance out.

Together, the inner spring members 68, the outer spring members 70 and the restraint members 90 form deployment structures 94 which position the reflective sheets 62 so that they concentrate solar radiation onto the solar panels 46. In particular, the inner spring members 68 hold the inner margin 64 and thereby balance the static forces which hold each reflective sheet 62 in the desired reflective position.

Operational concentration of solar radiation is illustrated in FIG. 5 which is a view similar to FIG. 4 with like elements represented by like reference numbers. In a central region of FIG. 5, solar radiation 100 falls directly onto the panel face 57 of the solar panel 46. In outer regions of FIG. 5, solar radiation 102 which would otherwise pass by the solar panel 46 is reflected from the reflective sheets 60 to be incident onto the panel face 57.

Solar cell conversion efficiency of incident solar radiation into electrical energy is a function of the angle of incidence and generally falls off with lesser angle of incidence. Accordingly, the radiation 102 that is reflected onto the panel face 57 by the solar reflectors 60 is converted into energy at a lower efficiency than the solar radiation 100 which is directly incident (a greater effect on conversion efficiency of all incident radiation is caused by the increased heating of the solar cells). Nonetheless, the output power from the solar cells of the solar panel 46 is significantly enhanced by addition of the redirected radiation 102. Accordingly, the solar reflectors 60 facilitate a reduction in the number of solar cells required for a given spacecraft power drain.

FIG. 4 is an end view of the solar reflectors 60 in their deployed position. From this state, the reflectors are easily rotated to a stowed position behind their associated solar panel 46 as illustrated in FIGS. 6 and 7. The outer spring members 70 are manually rotated away from the panel face 57 and towards the solar panel back face 106 (the hinges 80 are omitted in FIG. 6 to to more clearly show other structures). Each of the tethers 90 is received at the panel perimeter 55 into a tether guide 110.

Preferably, each guide 110 has a U-shaped cross section so that its tether is restrained laterally (as shown in FIG. 7 by a broken line path 112) and does not slip out of the guide. Because of the restraining action of the tether, the outer end of the outer spring member 70 is pulled closer to the hinge 76 as it rotates towards the back face 106. Consequently, the distortion of the outer spring member 70 is increased which provides a stored energy to deploy the solar reflector (60 in FIG. 3). To accommodate the decreased distance between the ends of the outer spring member, the reflective sheets 62 are folded as shown in FIG. 6.

In FIG. 7, an outer spring member 70 has reached its stowed position adjacent the panel back surface 106. A rotation point is established (e.g., by the hinge 80) about which the outer spring member 70 rotates as it moves between its stowed position and its deployed position (of FIGS. 3–5). The guide 110 is configured to form a path 112 so that at least some part of this path is spaced (e.g., by a space 114) from the rotation point of the hinge 80. In the embodiment of FIG. 7, the guide 110 forms an arcuate path 112 so that as the tether 90 is guided along the guide path 112, it is spaced at all parts of this path from the rotation point of the hinge 80.

Because of the space 114, a portion of the urging force of the distorted outer spring member 70 against the restraint of the tether 90 contains a downward vector component which initializes a rotational movement of the outer spring member 70 from its stowed position of FIG. 7 to its deployed position of FIGS. 3–5 (i.e., the spacing facilitates automatic rotation of said outer spring member from its stowed position to its deployed position). The guide 110 and its path 112 causes a mechanical moment (i.e., a torque) to be generated in the outer spring member 70 which urges it away from its stowed position. Although the guide 110 is configured in FIG. 7 to form an acurate guide path 112, other paths can also generate the needed mechanical moment.

Accordingly, as the solar panels 46 deploy from their stowed arrangement of FIG. 2A to their deployed configuration of FIG. 2C, their respective solar reflectors rotate from their back faces to the deployed position of FIG. 2C. Preferably, this rotation is delayed to insure that it does not interfere with the accordion movement of the solar panels 46 about their hinges 50. This delay can be accomplished by capturing each outer spring member 70 to its respective panel 46 with a releasable restraint (e.g., a mechanical latch or an explosive bolt). Once the panels 46 are safely deployed to the deployed configuration of FIG. 2C, the restraints can be released and the outer spring members automatically move to their deployed position of FIG. 2C.

The movement of the outer spring members 70 between their deployed and stowed positions is further enhanced by providing their inner end with a rotatable attachment as shown in FIG. 8. Extending outward from the hinge 80 (beneath the stop 82) is a hinge leaf 116 which rotatably carries the inner end 118 of the outer spring members 70 (e.g., by means of a pin 120). The inner end 118 can thus rotate between a deployed position 118A and either of two stowed positions 118B and 118C. In the stowed position 118B, the end 118 is directed away from the panel mid-region. In the stowed position 118C, the end 118 is directed upward along the panel mid-region. The stowed positions 118B and 118C enhance the ability of the outer spring members 70 to lie parallel to the panel back face 106 when in the stowed position of FIG. 7.

The stowed positions 118B and 118C also permit the outer spring members 70 to better use the limited space between the back faces of adjacent solar panels 46. For example, FIG. 9A shows the back surfaces 106 of adjacent panels 46A and 46B when they are in the deployed configuration of FIG. 2C. In each of these panels, the outer spring members are rotated on their respective hinge leaf 116. One set of outer spring members 70 is stowed with their inner ends 118 in the stowed position 118B and the other set is stowed with their inner ends 118 in the stowed position 118C. This arrangement is reversed in the adjacent solar panel 46B.

As a consequence, the outer spring members only overlap at discrete crossover points when the panels are in the stowed configuration of FIG. 2A as shown in FIG. 9B (for clarity, the panel 46A is assumed to be transparent in this view). As a result, the outer spring members can be more easily accommodated into the space between the back faces of the adjacent solar panels 46A and 46B. To reduce wear on the outer spring members 70 at the crossover points, the members can carry soft, resilient collars 119 (e.g., of foam rubber) as shown at an exemplary crossover point in FIG. 9A.

The outer ends of the outer spring members 70 are preferably rotatably coupled to their respective reflective sheet 62 to facilitate free movement of the sheet. This rotatable coupling can be realized, for example, with a flexible cord 121 that is received through a hole 122 in an outer end 123 of the outer spring member 70 and a hole 124 near the outer margin 66 of the reflective sheet 62 as shown in FIG. 10. This outer spring member's tether 90 can also be received through the hole 122. Other exemplary rotatable couplings can be formed by receiving the outer end 123 into a cup that is carried by the sheet corner 74 and formed with a ball and socket structure that is shared between the outer end 123 and the sheet corner 74. Preferably, the sheet corner 74 is strengthened by a doubler 125 that is indicated by a broken line. In addition, all edges of the sheet 62 may be strengthened by formation of similar doubler structures.

The outer ends of the inner spring members 68 are also preferably rotatably coupled to their respective reflective sheet 62 to facilitate free movement of the sheet. This rotatable coupling can be realized, as shown in FIG. 11A, with a flexible cord 127 that is received through a hole 128 near the inner margin 64 of the sheet 62 and received through an annular sleeve 129 that slides on the inner spring member 68. Stops 130 on the inner spring member limit the travel of the sleeve 129.

FIG. 11B is similar to FIG. 11A with like elements indicated by like reference numbers. This figure illustrates another rotatable coupling embodiment in which the inner spring member 68 is received through a doubled portion of the inner margin 64. The portion forms a channel 132 through which the inner spring member 68 is slidingly received.

Although FIG. 10 illustrates hole 124, FIG. 11A illustrates hole 128 and FIG. 11B illustrates channel 132 that facilitate attachment to the reflective sheet 62, many other attachment structures may be used. In an exemplary one, the thin-film sheet is reinforced near its corners with extra sheet portions to form a doubler. Cords such as the cords 121 and 127 of FIGS. 10 and 11A can be molded into this doubler and the cords coupled to the inner and outer spring members 68 and 70.

FIG. 7 illustrates that the stop 82 has a sloped face 134 which establishes the initial direction 88 of the inner end of the outer spring members 70 as indicated in FIG. 4. In addition, FIGS. 7 and 8 show rotatable couplings for the inner ends 118 of the outer spring members 70. Another embodiment of these structures is illustrated in FIG. 12 in which the inner end 118 of the outer spring member 70 is rotatably coupled to the solar panel 46 by a cord 136 which attaches to a bracket 138 at the panel perimeter 55. The upper leg 140 of the bracket 138 extends outward to form a stop 140 which abuts the inner end 118 of the outer spring member 70. This abutment sets the initial direction of the inner end (i.e., the direction 88 of FIG. 4).

The solar reflectors of FIGS. 1–12 can be realized with a variety of materials. In an exemplary realization, the reflective sheets 62 are formed of a lightweight, flexible thin-film polymer (e.g., polyimide or polyester in a thickness between 10 and 80 micrometers). To enhance the reflection of solar radiation (102 in FIG. 5), the sheet 62 preferably carries a reflective coating 144 of a metal (e.g., aluminum or silver deposited by vapor deposition) on its inner face as indicated locally in FIG. 5. The sheet material may be specular or diffused (e.g., via wrinkles, embossing, brushing and the like) for an optimal power output in various configurations (e.g., panel, wing and pointing configurations).

Large sheets 62 will typically accumulate a significant electrostatic charge which may cause damage to spacecraft electrical components (e.g., the solar cells 56). This charge can be safely dissipated if a path exists to conductive portions of the solar panels 46 (solar panels are typically formed of conductive materials that connect to an electrical ground). Preferably, therefore, the inner and outer spring members 68 and 70 and the tethers 62 form conductive paths from their associated reflective sheet. In an exemplary realization of these elements, therefore, the inner and outer spring members 68 and 70 are formed of resilient, elongate members of conductive graphite and resin composite and the tethers 90 are formed of metal-impregnated, polyamide fibers.

Another embodiment of the inner spring members 68 is formed by a conductive helical spring 146 as indicated in FIG. 3. One end of the spring is attached to a corner 72 of the reflective sheet. In order to urge the corner 72 towards the solar panel 46 and away from opposite corners of the inner and outer margins 64 and 66, the other spring end can be led past an axle of an interpanel hinge 50 and terminated on an adjacent solar panel 46A. Still other embodiments of the inner spring member 68 can be formed with various resilient structures (e.g., leaf springs).

The teachings of the invention can be practiced with various dimensional and geometrical variations of reflector structures. In an exemplary solar reflector of the invention, the deployment angle 92 is substantially 120 degrees and the width 152 of the reflective sheets 62 is 1.1 times the width 154 of the solar panel 46 (the deployment angle and the widths are shown in FIG. 4).

It has been calculated that this arrangement will increase the incident radiation on the panel face 57 by a factor greater than 2. It has been further calculated that this concentration factor is typically reduced to the range of 1.7 to 1.9 when pointing errors, reflector flatness, reflector specularity, reflector reflectivity and reflector defects are taken into account. It is estimated that this arrangement of a pair of solar reflectors (60 in FIG. 3) for a solar panel having approximately a 200 centimeter width and a 350 centimeter length will have a weight of approximately 2 kilograms.

Although embodiments of the invention have been illustrated with pairs of reflective sheets, inner spring members, outer spring members and tethers, the concepts and teachings of the invention can be followed to adapt single members of these structures so as to reflect solar radiation onto solar cells. To provide for spacecraft attitude errors, it may be desirable to extend the outer margin of the reflective sheets further from their respective solar panels than shown, for example, in FIG. 5. This extension will compensate for the attitude errors so that the solar panels continue to be fully covered with reflected radiation 102.

Although the inner and outer spring members 68 and 70 of the solar reflector embodiment 60 (shown, for example, in FIG. 2) have been particularly described as being coupled respectively to inner and outer margins of reflective sheets 62, the invention generally teaches coupling to any inner and outer parts of the sheets. In other embodiments of the invention, the coupling of the inner and outer spring members to a solar panel may be facilitated with other structures, e.g., a third member that is rotatably carried by the solar panel.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A solar reflector for concentrating solar radiation upon a panel face of a solar panel which extends to a panel perimeter, comprising:

at least one flexible, reflective sheet having an inner part and an outer part;

at least one inner spring member coupling said inner part to said panel and arranged to urge said inner part towards said panel;

at least one outer spring member coupling said outer part to said panel and arranged to urge said outer part away from said panel so that said inner and outer spring members cooperatively urge said reflective sheet towards a planar configuration, said outer spring member further arranged to urge said reflective sheet along a rotation away from said panel face; and at least one restraint member arranged to limit said rotation so that said reflective sheet is restrained in a deployed position in which it defines an angle with said panel to reflect solar radiation onto said panel face.

2. The solar reflector of claim 1, wherein said reflective sheet is formed of a thin-film polymer.

3. The solar reflector of claim 2, wherein said polymer is polyimide.

4. The solar reflector of claim 2, wherein said polymer is polyester.

5. The solar reflector of claim 1, wherein said reflective sheet carries a reflective coating.

6. The solar reflector of claim 5, wherein said reflective coating comprises aluminum.

7. The solar reflector of claim 1, wherein said inner spring member is a resilient, electrically-conductive, elongate member which forms a conduction path away from said reflective sheet.

8. The solar reflector of claim 7, wherein said elongate member is formed of a graphite and fiber composite.

9. The solar reflector of claim 1, wherein said inner spring member is a helical spring which forms a conduction path away from said reflective sheet.

10. The solar reflector of claim 1, wherein said inner spring member is rotatably coupled to said inner part.

11. The solar reflector of claim 1, wherein said outer spring member is a resilient, electrically-conductive, elongate member which forms a conduction path away from said reflective sheet.

12. The solar reflector of claim 11, wherein said elongate member is formed of a graphite and fiber composite.

13. The solar reflector of claim 11, wherein said elongate member is rotatably coupled to said outer part.

14. The solar reflector of claim 1, wherein said restraint member is an electrically-conductive tether which forms a conduction path away from said reflective sheet.

15. The solar reflector of claim 14, wherein said tether comprises a metal-impregnated polyamide fiber.

16. The solar reflector of claim 1, wherein said restraint member is coupled between said panel perimeter and said outer part.

17. The solar reflector of claim 1, wherein said angle is approximately 120 degrees.

18. The solar reflector of claim 1, wherein said outer spring member includes an inner portion which is rotatably coupled to said panel and further including a stop carried by said panel to abut said inner portion and facilitate the urging of said reflective sheet by said outer spring member that results in said rotation.

19. The solar reflector of claim 1, wherein said inner and outer spring members are rotatably coupled to said panel to facilitate rotating of said sheet and said inner and outer spring members to a stowed position behind said panel.

20. The solar reflector of claim 19, wherein:

said restraint member is a tether; and said outer spring member rotates about a rotation point;

and further including a guide positioned in the region of said panel perimeter to receive said tether when said outer spring member is in said stowed position, said guide configured to guide said tether along a guide path which is spaced from said rotation point to facilitate the rotation of said outer spring member from said stowed position to said deployed position.

21. The solar reflector of claim 20, wherein said guide path is an arcuate path about said rotation point.

22. A solar reflector for concentrating solar radiation upon a panel face of a solar panel which extends to a panel perimeter, comprising:

first and second flexible, reflective sheets, each of said reflective sheets having an inner margin and an outer margin; and first and second deployment structures respectively coupling said first and second reflective sheets to said panel;

wherein each of said deployment structures includes:

a) first and second inner spring members coupling first and second portions of the inner margin of a respective one of said reflective sheets to said panel, said first and second inner spring members arranged to urge said first and second inner margin portions away from each other and to urge said inner margin towards said panel;

b) first and second outer spring members coupling first and second portions of the outer margin of said respective reflective sheet to said panel, said first and second inner spring members arranged to urge said first and second outer margin portions away from each other and to urge said outer margin away from said panel so that said inner and outer spring members cooperatively urge said respective reflective sheet towards a planar configuration, said outer spring members further arranged to urge said respective reflective sheet in a rotation away from said panel face; and c) first and second restraint members coupled between said outer margin of said respective reflective sheet and said panel to limit said rotation so that said respective reflective sheet is restrained in a deployed position in which it defines an angle with said respective panel to reflect solar radiation onto said panel face.

23. The solar reflector of claim 22, wherein each of said reflective sheets includes:

a thin-film polymer member having inner and outer faces; and a reflective metallic coating on at least one face of said polymer member.

24. The solar reflector of claim 22, wherein each of said inner and outer spring members is a resilient, electrically-conductive, elongate member which forms a conduction path away from said reflective sheet.

25. The solar reflector of claim 22, wherein each of said restraint members is an electrically-conductive tether which forms a conduction path away from said reflective sheet.

26. The solar reflector of claim 22, wherein each of said outer spring members includes an inner portion which is rotatably coupled to said panel and wherein each of said deployment structures further includes first and second stops carried by said panel to respectively abut the inner portions of said first and second outer spring members and facilitate the urging of said respective reflective sheet by said outer spring members that results in said rotation.

27. The solar reflector of claim 22, wherein said inner and outer spring members are rotatably coupled to said panel to facilitate rotating of said sheet, said inner spring member and said outer spring member to a stowed position behind said panel.

28. The solar reflector of claim 22, wherein:

said first and second restraint member are respectively first and second tethers;

said inner and outer spring members are rotatably coupled to said panel to facilitate rotating of said sheets and said inner and outer spring members to a stowed position behind said panel;

said outer spring members rotate about respective rotation points;

and each of said deployment structures further includes first and second guides positioned in the region of said panel perimeter to respectively receive said first and second tethers when said outer spring members are in said stowed position, said guides configured to guide said tethers along guide paths which are each spaced from a respective rotation point to facilitate the rotation of said outer spring members from said stowed position to said deployed position.

29. A method of concentrating solar radiation upon a panel face of a solar panel, comprising the steps of:

urging a flexible, reflective sheet towards a planar configuration;

urging said reflective sheet along a rotation away from said panel face which includes the step of moving said reflective sheet with resilient, elongate members; and limiting said rotation so that said reflective sheet is in a deployed position in which it defines an angle with said panel to reflect solar radiation upon said panel face.

30. The method of claim 29, further including the step of conducting electrical charges away from said reflective sheet.

31. A spacecraft system, comprising:

a spacecraft;

at least one solar panel carried by said spacecraft to convert solar radiation into electrical power; and a reflector arranged to concentrate said solar radiation onto said solar panel, said reflector including:

a) at least one flexible, reflective sheet having an inner part and an outer part;

b) at least one inner spring member coupling said inner part to said panel and arranged to urge said inner part towards said panel;

c) at least one outer spring member coupling said outer part to said panel and arranged to urge said outer part away from said panel so that said inner and outer spring members cooperate to urge said reflective sheet towards a planar configuration, said outer spring member further arranged to urge said reflective sheet in a rotation away from said panel face; and d) at least one restraint member arranged to limit said rotation so that said reflective sheet is restrained in a deployed position in which it defines an angle with said panel to reflect solar radiation upon said panel face.

32. The spacecraft system of claim 31, wherein said reflective sheet is formed of a thin-film polymer.

33. The spacecraft system of claim 31, wherein said inner and outer spring members are each a resilient, electrically-conductive, elongate member which forms a conduction path away from said reflective sheet.

34. The spacecraft system of claim 31, wherein said inner spring member is a helical spring which forms a conduction path away from said reflective sheet.

35. The spacecraft system of claim 31, wherein said restraint member is an electrically-conductive tether which forms a conduction path away from said reflective sheet.

36. The spacecraft system of claim 31, wherein said outer spring member includes an inner portion which is rotatably coupled to said panel and further including a stop carried by said panel to abut said inner portion and enhance the urging of said reflective sheet by said outer spring member that results in said rotation.

37. The spacecraft system of claim 31, wherein said inner spring member and said outer spring member are rotatably coupled to said panel to facilitate rotating of said sheet, said inner spring member and said outer spring member to a stowed position behind said panel.

38. The spacecraft system of claim 31, wherein:

said restraint member is a tether; and said outer spring member rotates about a pivot line;

and further including a guide positioned in the region of said panel perimeter to receive said tether when said outer spring member is in said stowed position, said guide configured to guide said tether along a guide path which is spaced from said pivot line to facilitate conversion of the resilience of said outer spring member into a movement between said stowed position and said deployed position.

39. The spacecraft system of claim 31, wherein said guide path is an arcuate path about said rotation point.

\* \* \* \* \*